US012648378B2

(12) United States Patent
Yuan et al.

(10) Patent No.: US 12,648,378 B2
(45) Date of Patent: Jun. 2, 2026

(54) METHOD FOR FABRICATING SEMICONDUCTOR DEVICE

(71) Applicant: United Semiconductor (Xiamen) Co., Ltd., Xiamen (CN)

(72) Inventors: Linshan Yuan, Shamen City (CN); Guang Yang, Shamen City (CN); Liangfeng Zhang, Shamen City (CN); Jinjian Ouyang, Xiamen (CN); Chin-Chun Huang, Hsinchu County (TW); Wen Yi Tan, Xiamen (CN)

(73) Assignee: United Semiconductor (Xiamen) Co., Ltd., Xiamen (CN)

( * ) Notice: Subject to any disclaimer, the term of this patent is extended or adjusted under 35 U.S.C. 154(b) by 438 days.

(21) Appl. No.: 18/510,689

(22) Filed: Nov. 16, 2023

(65) Prior Publication Data

US 2025/0118560 A1 Apr. 10, 2025

(30) Foreign Application Priority Data

Oct. 9, 2023 (CN) .......................... 202311299003.5

(51) Int. Cl.
| | |
|---|---|
| *H10P 30/20* | (2026.01) |
| *H10D 30/01* | (2025.01) |
| *H10D 62/00* | (2026.01) |
| *H10D 64/01* | (2025.01) |
| *H10P 76/40* | (2026.01) |

(52) U.S. Cl.
CPC ......... *H10P 30/20* (2026.01); *H10D 30/0227* (2025.01); *H10D 62/021* (2025.01); *H10P 76/405* (2026.01); *H10D 64/021* (2025.01)

(58) Field of Classification Search
CPC .... H10P 30/20; H10P 30/6715; H10P 76/405; H10P 32/10; H10D 62/021; H10D 30/0227; H10D 30/601; H10D 30/0212
See application file for complete search history.

(56) References Cited

U.S. PATENT DOCUMENTS

| | | | | | |
|---|---|---|---|---|---|
| 6,124,190 | A | * | 9/2000 | Yamamoto | ......... H10D 30/0212 257/E21.199 |
| 6,133,122 | A | * | 10/2000 | Yamamoto | ............ H10P 30/204 438/533 |
| 2003/0236003 | A1 | * | 12/2003 | Koo | ..................... H10W 20/033 438/653 |
| 2021/0193653 | A1 | * | 6/2021 | Ho | ........................ H10D 84/834 |

* cited by examiner

*Primary Examiner* — Alia Sabur
(74) *Attorney, Agent, or Firm* — Winston Hsu

(57) ABSTRACT

A method for fabricating a semiconductor device includes steps as follows. A gate structure is formed on a substrate. A fluorine-containing dopant is implanted into the substrate to form two lightly doped drain regions at two sides of the gate structure. A thermal treatment process is performed, in which a part of fluorine atoms of the fluorine-containing dopant diffuse onto a surface of the substrate. The part of fluorine atoms are removed.

9 Claims, 6 Drawing Sheets

METHOD FOR FABRICATING SEMICONDUCTOR DEVICE

BACKGROUND OF THE INVENTION

1. Field of the Invention

The present disclosure relates to the field of semiconductor devices, and more particularly, to a method for fabricating a semiconductor device having a fluorine-containing dopant.

2. Description of the Prior Art

In order to increase the carrier mobility of a semiconductor device, a compressive stress or a tensile stress may be applied to a gate channel. For example, when the compressive stress is applied, the selective epitaxial growth (SEG) technique it commonly used in the conventional art to form an epitaxial structure having a lattice arrangement similar to that of the silicon substrate in the silicon substrate, such as a silicon germanium (SiGe) epitaxial structure. With the lattice constant of the SiGe epitaxial structure being greater than that of the silicon substrate, a stress is produced to the gate channel of a PMOS (p-type metal oxide semiconductor) transistor, and the carrier mobility is increased in the gate channel. Accordingly, the speed of MOS transistor is improved. Conversely, as for an NMOS (n-type metal oxide semiconductor) transistor, a silicon carbide (SiC) epitaxial structure may be formed in the silicon substrate to produce a tensile stress to the gate channel of the NMOS transistor.

When forming the aforementioned epitaxial structure, a recess may be formed in the substrate by forming a hard mask and cooperating with processes, such as lithography process and etching process, to define the region where the epitaxial structure is disposed. However, the peeling of the aforementioned hard mask may occur and affect the properties and the yield of the semiconductor device subsequently formed.

SUMMARY OF THE INVENTION

According to one aspect of the present disclosure, a method for fabricating a semiconductor device includes steps as follows. A gate structure is formed on a substrate. A fluorine-containing dopant is implanted into the substrate to form two lightly doped drain regions at two sides of the gate structure. A thermal treatment process is performed, in which a part of fluorine atoms of the fluorine-containing dopant diffuse onto a surface of the substrate. The part of fluorine atoms are removed.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1, FIG. 2, FIG. 3, FIG. 4, FIG. 5, FIG. 6, FIG. 7, FIG. 8 and FIG. 9 are schematic cross-sectional views showing steps of methods for fabricating a semiconductor device according to a first embodiment and a second embodiment of the present disclosure.

DETAILED DESCRIPTION

In the following detailed description of the embodiments, reference is made to the accompanying drawings which form a part thereof, and in which is shown by way of illustration specific embodiments in which the disclosure may be practiced. In this regard, directional terminology, such as up, down, left, right, front, back, bottom or top is used with reference to the orientation of the Figure(s) being described. The elements of the present disclosure can be positioned in a number of different orientations. As such, the directional terminology is used for purposes of illustration and is in no way limiting. In addition, identical numeral references or similar numeral references are used for identical elements or similar elements in the following embodiments.

Hereinafter, for the description of "the first feature is formed on or above the second feature", it may refer that "the first feature is in contact with the second feature directly", or it may refer that "there is another feature between the first feature and the second feature", such that the first feature is not in contact with the second feature directly.

It is understood that, although the terms first, second, etc. may be used herein to describe various elements, regions, layers and/or sections, these elements, regions, layers and/or sections should not be limited by these terms. These terms may be only used to distinguish one element, region, layer and/or section from another element, region, layer and/or section. Terms such as "first," "second," and other numerical terms when used herein do not imply a sequence or order unless clearly indicated by the context. Thus, a first element, region, layer and/or section discussed below could be termed a second element, region, layer and/or section without departing from the teachings of the embodiments. The terms used in the claims may not be identical with the terms used in the specification, but may be used according to the order of the elements claimed in the claims.

Figure 1:
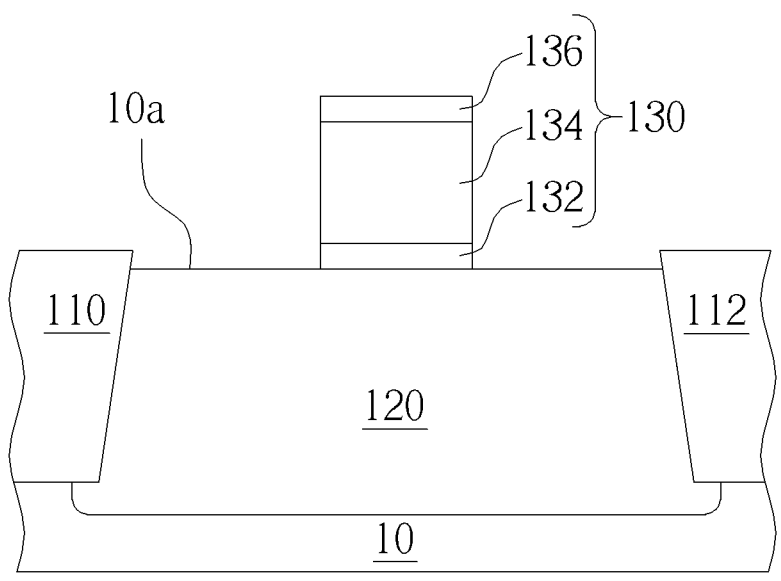

Please refer to FIG. 1 to FIG. 8, which are schematic cross-sectional views showing steps of a method for fabricating a semiconductor device according to a first embodiment of the present disclosure. In the embodiment, the semiconductor device 1 (see FIG. 8) is exemplary a PMOS transistor for explanation. As shown in FIG. 1, a gate structure 130 is firstly formed on a substrate 10. The substrate 10 may be a silicon substrate, an epitaxial silicon substrate, a silicon carbide substrate or a silicon on insulator (SOI) substrate.

The substrate 10 may include insulating structures 110, 112 and a well region 120. For example, the insulating structures 110 and 112 may be firstly formed in the substrate 10. The insulating structures 110 and 112 are configured to provide electrical isolation function. For example, the substrate 10 may include at least one shallow trench isolation (STI) to surround each active region. The two insulating structures 110 and 112 shown in FIG. 1 may be a left portion and a right portion of a shallow trench isolation, and the region between the two insulating structures 110 and 112 may be an active region. Materials of the insulating structures 110 and 112 may include a dielectric material, such as silicon dioxide. Next, an ion implantation process (not shown) may be performed to form the well region 120 in the substrate 10. The dopant of the well region 120 may be adjusted depending on the subsequently formed semiconductor device being applied to an NMOS transistor or a PMOS transistor. In the embodiment, the semiconductor device 1 is exemplary a PMOS transistor. Therefore, the well region 120 is an N-type well region, and the well region 120 may be doped with N-type dopants, such as arsenic, phosphorus, etc.

The gate structure 130 includes a gate dielectric layer 132, a gate material layer 134 and a mask layer 136 in sequence from bottom to top. In the embodiment, the formation of the gate structure 130 may be accomplished by a gate first process, a high-k first approach of a gate last process, or a high-k last approach of a gate last process. In the embodiment, the gate structure 130 is exemplary formed by a high-k last approach. A gate dielectric material, a gate material and a mask material may be formed sequentially on the substrate 10 by a deposition process, and a pattern transfer process may be performed by using a patterned photoresist (not shown) as mask to remove a portion of the mask material, a portion of the gate material and a portion of the gate dielectric material by a single etching process or multiple etching processes. Next, the patterned photoresist is removed, and the gate structure 130 including the gate dielectric layer 132, the gate material layer 134 and the mask layer 136 is formed on a surface 10a of the substrate 10. The material of the gate dielectric layer 132 may include, but is not limited to, oxides and/or nitrides. The oxide, for example, may include silicon dioxide ($SiO_2$). The nitride, for example, may include silicon nitride (SiN). The material of the gate material layer 134 may include, but is not limited to, non-metallic conductive materials, such as polycrystalline silicon. The material of the mask layer 136 may include, but is not limited to, silicon dioxide ($SiO_2$), silicon nitride (SiN), silicon carbide (SiC) and/or silicon oxynitride (SiON).

In addition, although the embodiment takes a planar transistor as an example, in other modified embodiments, the method for fabricating the semiconductor device of the present disclosure may also be applied to a non-planar transistor, such as a transistor with a fin-shaped structure. In this case, the portion of the substrate 10 shown in FIG. 1 may represent the fin-shaped structure formed on the substrate 10.

Figure 2:
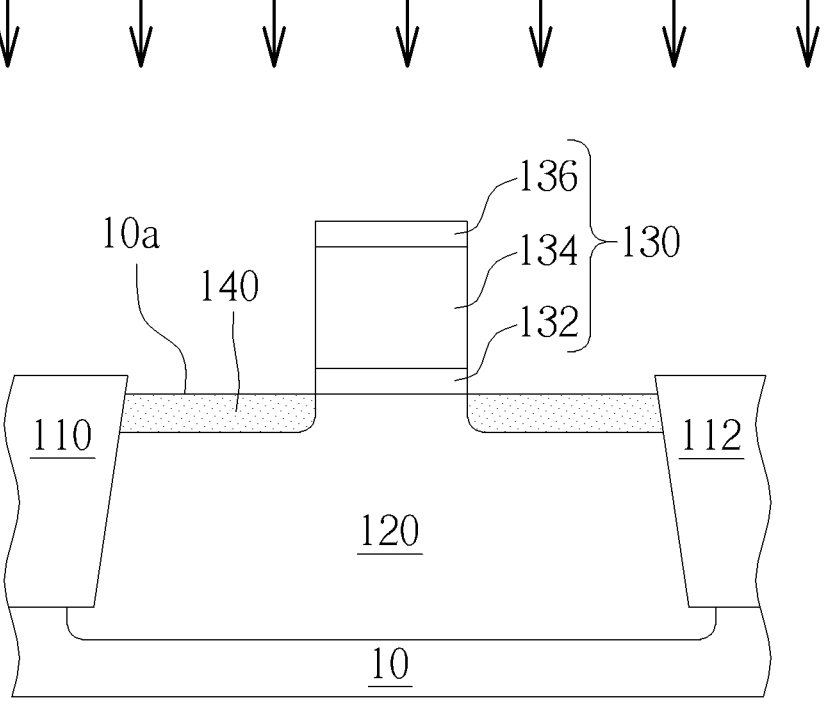

Next, as shown in FIG. 2, an offset spacer (not shown) may be optionally formed to surround the gate structure 130. Next, an ion implantation process P1 is performed to implant a fluorine-containing dopant into the substrate 10 to form two lightly doped drain regions 140 at two sides of the gate structure 130. The conductivity types of the two lightly doped drain regions 140 are identical to each other, and are different from the conductivity type of the well region 120. In the embodiment, the well region 120 is an N-type well region, and the conductivity types of the two lightly doped drain regions 140 are P-type. Therefore, in the ion implantation process P1, P-type dopants are implanted into the substrate 10. The fluorine-containing dopant may be one of the components of the P-type dopant. The fluorine-containing dopant may include a fluoride of an element of Group 13 (also called Group IIIA). For example, the fluorine-containing dopant may include fluorides of boron (B), aluminum (Al), gallium (Ga), or indium (In). According to one embodiment of the present disclosure, the fluorine-containing dopant may include boron difluoride ($BF_2$), but not limited thereto. The energy for implanting the fluorine-containing dopant may be 10 KeV to 35 KeV, and the dose may be 1E13 atoms/cm² to 1E17 atoms/cm².

Figures 3, 4:
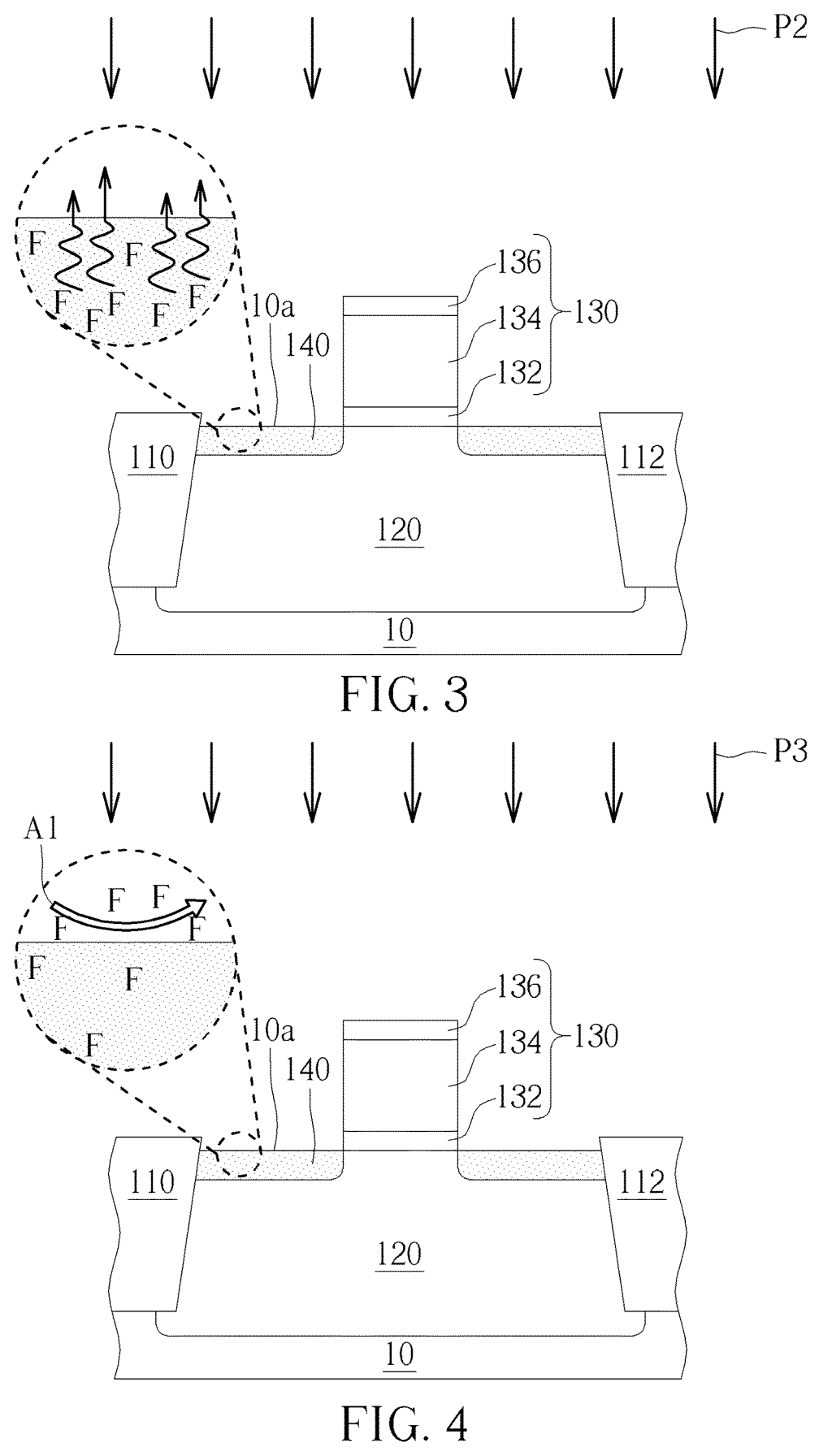

Next, as shown in FIG. 3, a thermal treatment process P2 is performed, in which a part of fluorine atoms of the fluorine-containing dopant diffuse onto the surface 10a of the substrate 10. The aforementioned phrase "a part of fluorine atoms of the fluorine-containing dopant diffuse onto the surface 10a of the substrate 10" refers that the fluorine-containing dopant includes a plurality of fluorine atoms, some of the fluorine atoms of the fluorine-containing dopant diffuse onto the surface 10a of the substrate 10, while the rest of the fluorine atoms of the fluorine-containing dopant remain in the substrate 10. The aforementioned "fluorine atom" generally refers to substances including fluorine atoms, such as a neutral atom of fluorine (i.e., a fluorine atom which is electrically neutral due to the number of electrons and the number of protons being the same) or a fluoride ion which is negatively charged, but not limited thereto. The thermal treatment process P2 may be performed at 600° C. to 1300° C. for 10 seconds to 100 seconds. The process of implanting the dopant into the substrate 10 (such as the ion implantation process to form the well region 120 and the ion implantation process P1 to form the lightly doped drain regions 140) will disrupt the lattice arrangement of the substrate 10. With the thermal treatment process P2, the lattice arrangement of substrate 10 can be repaired.

Next, as shown in FIG. 4, for example, a gas cleaning process P3 may be performed to remove the part of the fluorine atoms that diffuse onto the surface 10a of the substrate 10. Herein, a gas is introduced to clear the part of the fluorine atoms on the surface 10a of the substrate 10. In FIG. 4, the arrow A1 represents the flow direction of the gas. That is, the gas can clear the fluorine atoms by physical method. The aforementioned gas may include, for example, oxygen ($O_2$), argon (Ar), carbon dioxide ($CO_2$) or hydrogen ($H_2$).

Figure 5:
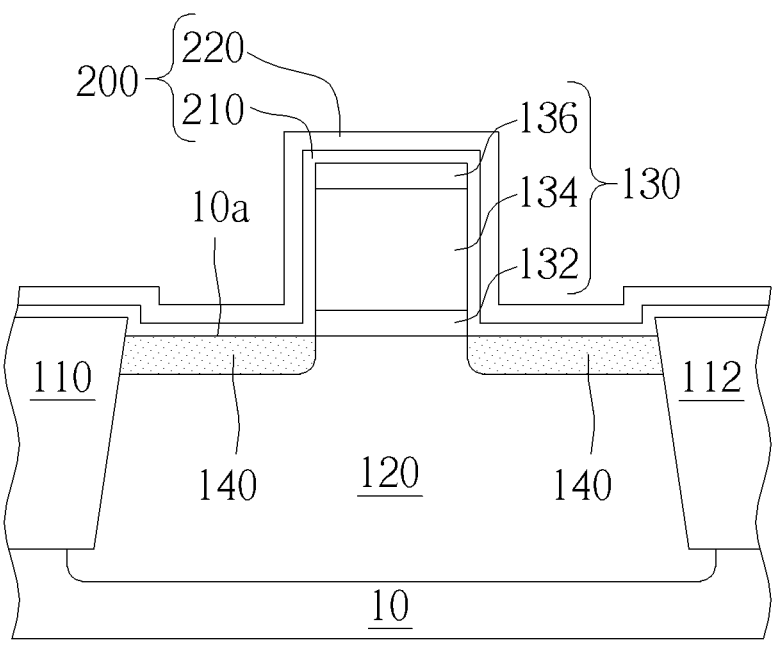

Next, as shown in FIG. 5, a hard mask layer 200 is formed on the gate structure 130 and the two lightly doped drain regions 140. The hard mask layer 200 may include a first sub-layer 210 and a second sub-layer 220 in sequence from bottom to top. The material of the first sub-layer 210 may include an oxide, such as silicon dioxide. The material of the second sub-layer 220 may include a nitride, such as silicon nitride, silicon oxynitride or silicon carbonitride.

Figure 6:
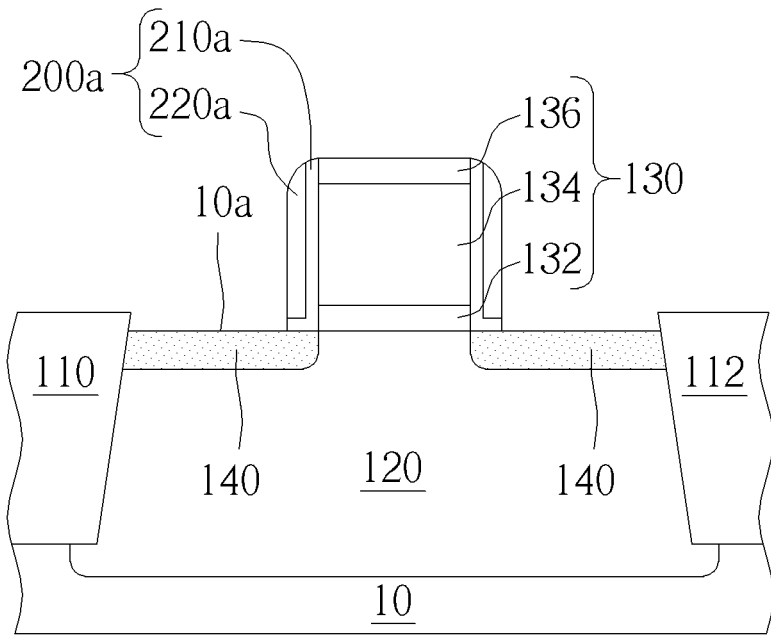

Next, as shown in FIG. 6, the hard mask layer 200 is patterned to expose the surface 10a of the substrate 10 located at the two sides of the gate structure 130. For example, an etching process may be performed to remove a portion of the hard mask layer 200 to form a spacer 200a surrounding the gate structure 130. Herein, the spacer 200a includes a first spacer 210a and a second spacer 220a in sequence from inside to outside, so that the spacer 200a is a composite structure. The first spacer 210a is formed by patterning the first sub-layer 210, and the second spacer 220a is formed by patterning the second sub-layer 220.

Figure 7:
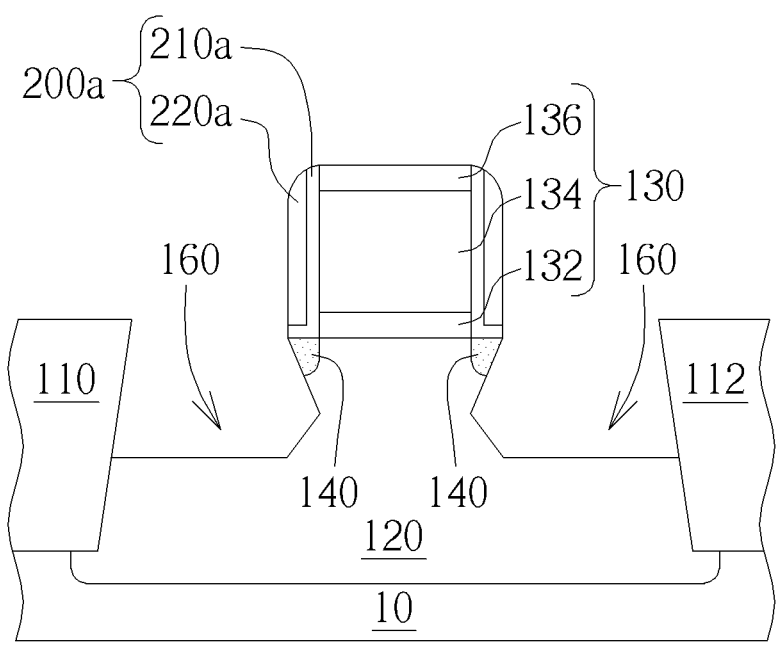

Next, as shown in FIG. 7, two recesses 160 are formed in the substrate 10 at the two sides of the gate structure 130. For example, a dry etching process and/or a wet etching process may be performed, in which the gate structure 130 and the spacer 200a are used as etching masks, and a single etching process or multiple etching processes are performed to remove a portion of the substrate 10 to form the two recesses 160 in the substrate 10 at the two sides of the gate structure 130.

Figure 8:
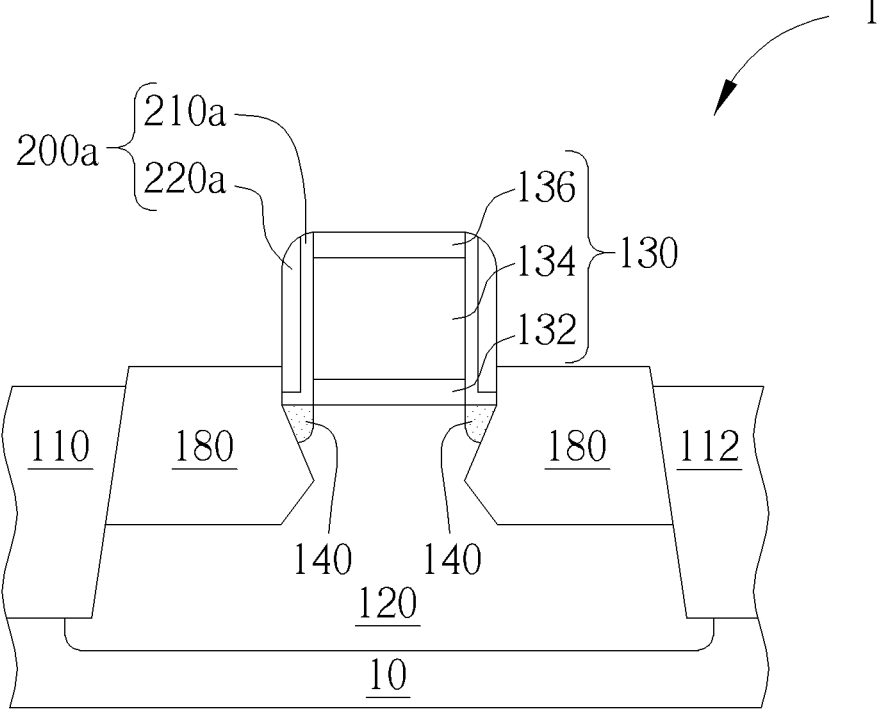

Next, as shown in FIG. 8, two epitaxial layers 180 are formed in the two recesses 160. For example, a selective epitaxial growth process may be performed to form the two epitaxial layers 180 in the two recesses 160. The material of the epitaxial layer 180, for example, may include silicon germanium (SiGe), but not limited thereto. Before forming the two epitaxial layers 180, two buffer layers (not shown) may be optionally formed in the two recesses 160, and the two epitaxial layers 180 are respectively disposed on the two buffer layers. After forming the two epitaxial layers 180, two cap layers (not shown) may be optionally formed on the two epitaxial layers 180, respectively. The material of the cap layer, for example, may include silicon. Thereby, the fabrication of the semiconductor device 1 is completed.

According to the present disclosure, when forming the epitaxial layers 180, an in-situ implantation process and an annealing process may be performed to implant dopants into the epitaxial layers 180 to form source/drain regions (not labeled). Alternatively, after the epitaxial layers 180 are formed, the implantation process and the annealing process are performed to form the source/drain regions. The above two methods to form the source/drain regions are all within the scope of the present disclosure.

Although not shown in the drawings, the method for fabricating the semiconductor device may further include other processes for fabricating transistors. For example, a contact etch stop layer (CESL) and an interlayer dielectric (ILD) layer may be formed in sequence to cover the gate structure 130 and the epitaxial layers 180. A replacement metal gate (RMG) process may be performed to replace the gate structure 130 including the non-metallic conductive material with a metal gate. Afterwards, contact plugs are formed in the interlayer dielectric layer to electrically connect to the epitaxial layers 180 and/or the source/drain regions.

In the method for fabricating the semiconductor device shown in FIG. 1 to FIG. 8, before forming the hard mask layer 200, the thermal treatment process P2 is performed to allow a part of the fluorine atoms of the fluorine-containing dopant to diffuse onto the surface 10a of the substrate 10. Then the hard mask layer 200 is formed after the gas is introduced to clear the part of the fluorine atoms on the surface 10a of the substrate 10. Thereby, the probability that the fluorine atoms diffuse into the hard mask layer 200 can be reduced. For example, it may reduce the formation of local bulges (due to the increase in thickness) of the first sub-layer 210 caused by the fluorine atoms relaxing the bonds between atoms in the first sub-layer 210. Accordingly, the probability of the peeling of the second sub-layer 220 caused by the local bulges of the first sub-layer 210 can be reduced.

Figure 9:
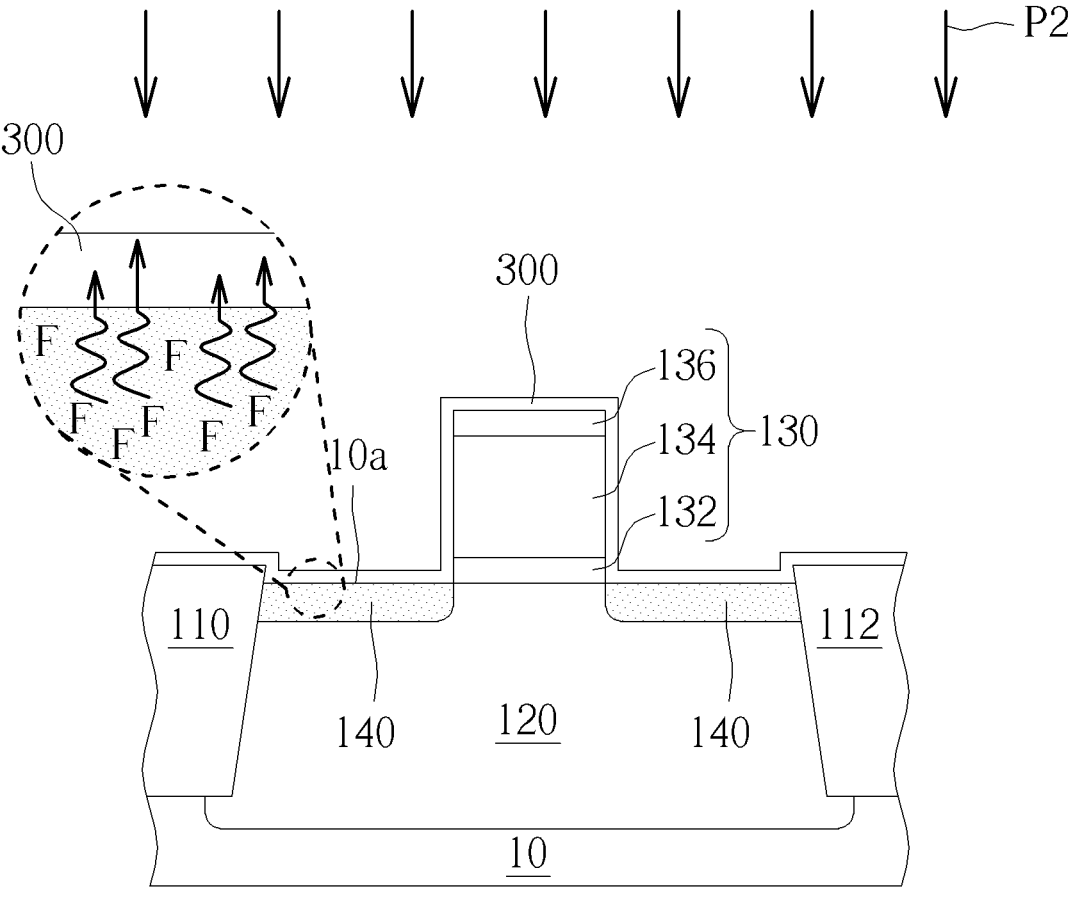

Please refer to FIG. 1, FIG. 2, FIG. 9, and FIG. 5 to FIG. 8 in sequence, which are schematic cross-sectional views showing steps of a method for fabricating a semiconductor device according to a second embodiment of the present disclosure. In the embodiment, the semiconductor device 1 (see FIG. 8) is exemplary a PMOS transistor for explanation. As shown in FIG. 1, the gate structure 130 is firstly formed on the substrate 10. Next, as shown in FIG. 2, the ion implantation process P1 is performed to implant the fluorine-containing dopant into the substrate 10 to form the two lightly doped drain regions 140 at the two sides of the gate structure 130. Next, as shown in FIG. 9, a sacrificial layer 300 is formed on the gate structure 130 and the two lightly doped drain regions 140. The material of the sacrificial layer 300 may include an oxide, such as silicon dioxide. Next, the thermal treatment process P2 is performed, in which a part of the fluorine atoms of the fluorine-containing dopant diffuse onto the surface 10a of the substrate 10 and enter into the sacrificial layer 300. Next, the sacrificial layer 300 is removed, for example, by an etching process. Next, as shown in FIG. 5, the hard mask layer 200 is formed on the gate structure 130 and the two lightly doped drain regions 140. Next, as shown in FIG. 6, the hard mask layer 200 is patterned to expose the surface 10a of the substrate 10 located at the two sides of the gate structure 130, and a spacer 200a is formed to surround the gate structure 130. Next, as shown in FIG. 7, a portion of the substrate 10 is removed to form the two recesses 160 in the substrate 10 at the two sides of the gate structure 130. Next, as shown in FIG. 8, a selective epitaxial growth process may be performed to form the two epitaxial layers 180 in the two recesses 160. Thereby, the fabrication of the semiconductor device 1 is completed.

The main difference between the second embodiment and the first embodiment is that the sacrificial layer 300 is formed before the thermal treatment process P2 in the second embodiment. In the thermal treatment process P2, a part of the fluorine atoms of the fluorine-containing dopant diffuse onto the surface 10a of the substrate 10 and enter into the sacrificial layer 300. The part of the fluorine atoms diffusing onto the surface 10a of the substrate 10 are removed by removing the sacrificial layer 300, and then the hard mask layer 200 is formed. Therefore, in the second embodiment, there is no need to introduce the gas to clear the fluorine atoms on the surface 10a of the substrate 10. In addition, since the thermal treatment process P2 is performed before forming the hard mask layer 200, and the fluorine atoms diffusing onto the surface 10a of the substrate 10 are removed together with the sacrificial layer 300, the second embodiment can also reduce the probability of the fluorine atoms diffusing into the hard mask layer 200. For example, it may reduce the formation of local bulges (due to the increase in thickness) of the first sub-layer 210 caused by the fluorine atoms relaxing the bonds between atoms in the first sub-layer 210. Accordingly, the probability of the peeling of the second sub-layer 220 caused by the local bulges of the first sub-layer 210 can be reduced.

Figure 10:
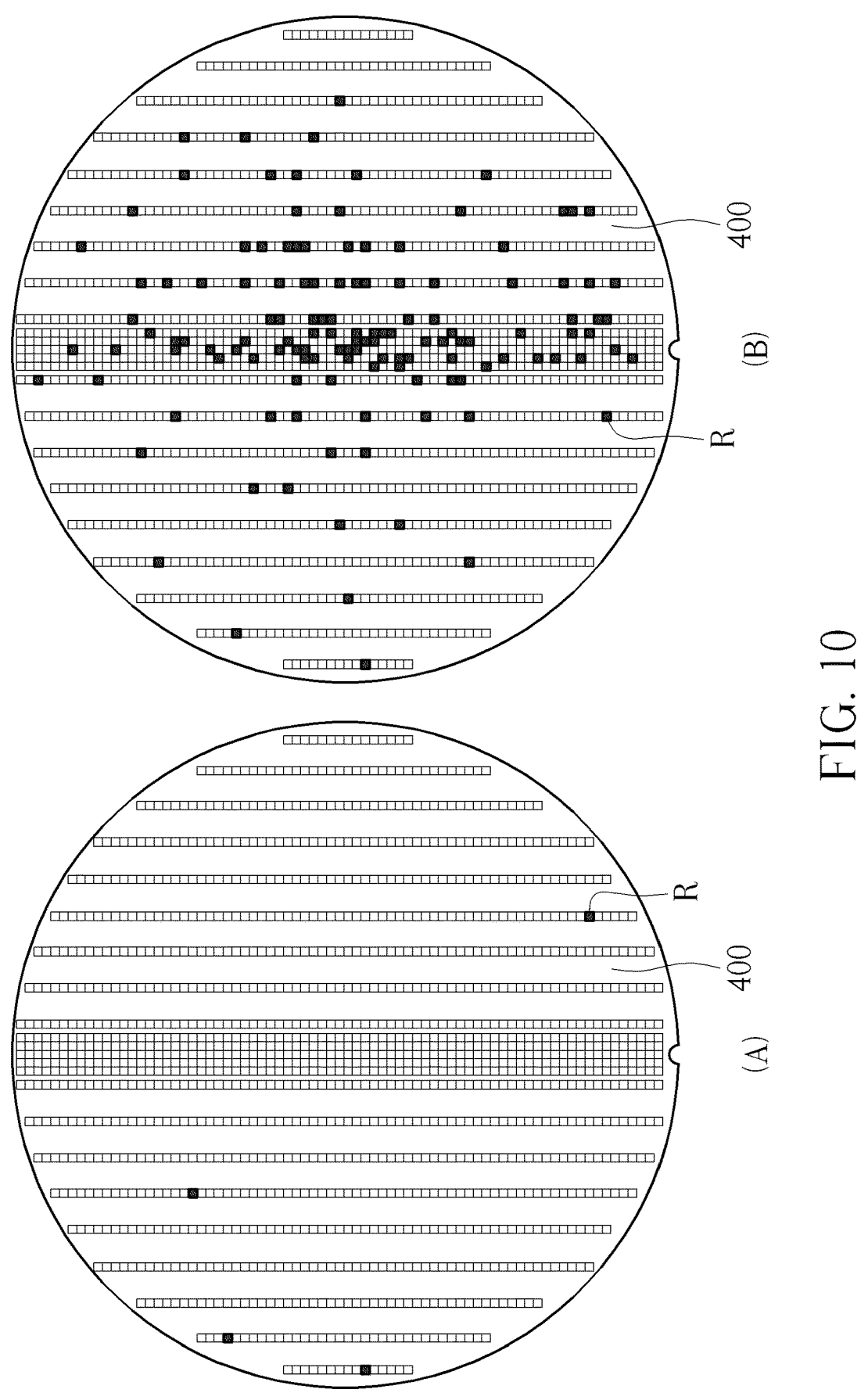
FIG. 10 is a schematic diagram showing the observation results of defects of an example according to the present disclosure and a comparative example.

Please refer to FIG. 10, which is a schematic diagram showing the observation results of defects of an example according to the present disclosure and a comparative example. The portion A and the portion B in FIG. 10 are the scanning results of a semiconductor device of the example according to the present disclosure and a semiconductor device of the comparative example respectively obtained by a defect scanning machine. The semiconductor devices correspond to the products of the process stage after FIG. 5 and before FIG. 6. The defect scanning machine does not scan the entire wafer 400, the regions that are completely blank represent the regions not being scanned, and the regions with square cells represent the regions being scanned. Each square cell on the wafer 400 represents a die. The square cell with a thicker frame and sprinkled dots represents a die in which the defect R is observed. The defect R can represent the peeling of the hard mask layer. The square cell without the thicker frame and the sprinkled dots (i.e., a blank square cell) represents a die in which the defect R is not observed. The semiconductor device of the example is fabricated according the method of the first embodiment of the present disclosure. The difference between the method for fabricating the semiconductor device of the comparative example and the method of the first embodiment is as follows. In the method for fabricating the semiconductor device of the comparative example, the thermal treatment process is performed after forming the hard mask layer and before patterning the hard mask layer, and the gas cleaning process is not included therein. According to the method for fabricating the semiconductor device of the comparative example, the thermal treatment process will cause a part of the fluorine atoms of the fluorine-containing dopant to diffuse onto the surface of the substrate and enter into the first sub-layer of the hard mask layer, such that the bonds between atoms in the first sub-layer are relaxed by fluorine atoms. As a result, the thickness of at least one portion of the first sub-layer is increased and the portion of the first sub-layer bulges upwardly (that is, at least one local bulge is formed in the first sub-layer), which causes the peeling of the second sub-layer. As shown in FIG. 10, the number of the dies with defect R on the wafer 400 of the example is much less than the number of the dies with defect R on the wafer 400 of the comparative example. It is obvious that the method for fabricating the semiconductor device according to the present disclosure can significantly reduce the generation of the peeling of the hard mask layer of the semiconductor device fabricated thereby. Accordingly, the properties and yield of the semiconductor device fabricated thereby can be significantly improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:

forming a gate structure on a substrate;

implanting a fluorine-containing dopant into the substrate to form two lightly doped drain regions at two sides of the gate structure;

performing a thermal treatment process, wherein a part of fluorine atoms of the fluorine-containing dopant diffuse onto a surface of the substrate; and removing the part of the fluorine atoms, wherein removing the part of the fluorine atoms is introducing a gas to clear the part of the fluorine atoms.

2. The method of claim 1, after removing the part of the fluorine atoms, the method further comprising:

forming a hard mask layer on the gate structure and the two lightly doped drain regions.

3. The method of claim 2, wherein the hard mask layer comprises a first sub-layer, and a material of the first sub-layer comprises an oxide.

4. The method of claim 3, wherein the hard mask layer further comprises a second sub-layer disposed on the first sub-layer, and a material of the second sub-layer comprises a nitride.

5. The method of claim 2, further comprising:

patterning the hard mask layer to expose the surface of the substrate located at the two sides of the gate structure;

forming two recesses in the substrate at the two sides of the gate structure; and forming two epitaxial layers respectively in the two recesses.

6. The method of claim 1, wherein the fluorine-containing dopant comprises a fluoride of an element of Group 13.

7. The method of claim 1, wherein an energy for implanting the fluorine-containing dopant is 10 KeV to 35 KeV, and a dose is 1E13 atoms/cm$^2$ to 1E17 atoms/cm$^2$.

8. The method of claim 1, wherein the thermal treatment process is performed at 600° C. to 1300° C. for 10 seconds to 100 seconds.

9. The method of claim 1, wherein the gas comprises oxygen, argon, carbon dioxide or hydrogen.

\* \* \* \* \*